(12) United States Patent
Kanawati et al.

(10) Patent No.: US 10,587,114 B2
(45) Date of Patent: Mar. 10, 2020

(54) BI-DIRECTIONAL ELECTROSTATIC DISCHARGE PROTECTION DEVICE FOR RADIO FREQUENCY CIRCUITS

(71) Applicant: Newport Fab, LLC, Newport Beach, CA (US)

(72) Inventors: Roda Kanawati, Irvine, CA (US); Samir Chaudhry, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 313 days.

(21) Appl. No.: 15/596,607

(22) Filed: May 16, 2017

(65) Prior Publication Data
US 2018/0337170 A1     Nov. 22, 2018

(51) Int. Cl.
*H02H 9/04*      (2006.01)
*H01L 23/66*    (2006.01)
*H01L 27/02*    (2006.01)

(52) U.S. Cl.
CPC .......... *H02H 9/046* (2013.01); *H01L 23/66* (2013.01); *H01L 27/0274* (2013.01); *H01L 2223/6677* (2013.01)

(58) Field of Classification Search
CPC ...... H02H 9/046; H01L 23/66; H01L 27/0274
See application file for complete search history.

(56) References Cited

U.S. PATENT DOCUMENTS

| | | | | |
|---|---|---|---|---|
| 4,750,078 A * | 6/1988 | Ganger | ............ | H03K 17/08126 257/360 |
| 5,202,590 A * | 4/1993 | Liepold | .................. | H03F 1/301 327/312 |
| 7,408,751 B1 * | 8/2008 | Lien | ...................... | H02H 9/046 361/56 |
| 9,019,670 B2 * | 4/2015 | Steinhoff | ................. | H02H 3/20 361/111 |
| 2009/0261883 A1 * | 10/2009 | Bobde | ................. | H01L 27/0259 327/310 |
| 2013/0215808 A1 * | 8/2013 | Muthukrishnan | ...... | H02H 9/045 370/297 |
| 2014/0177113 A1 * | 6/2014 | Gueorguiev | ........ | H01L 27/0248 361/56 |

* cited by examiner

*Primary Examiner* — Scott Bauer
(74) *Attorney, Agent, or Firm* — Bever, Hoffman & Harms, LLP (57) ABSTRACT

A bi-directional ESD protection device for an RF circuit that utilizes two pre-driver FETs to reliably maintain the gate voltage of a ggNMOS-type main transistor the lowest applied voltage (e.g., 0V) in order to maximize the main transistor's drain-to-source breakdown voltage, which determines the trigger voltage of the ESD protection device. One pre-driver FET couples the main transistor's gate to ground during positive voltage input signal phases, and the other pre-driver FET couples the main transistor's gate to the input signal path during negative voltage input signal phases. While the amplitude of the input signals remains below the main transistor's trigger voltage, the main transistor remains completely turned off, whereby the input signals are passed to I/O circuitry with minimal interference. Whenever the input signal exceeds the trigger voltage, the main transistor turns on to shunt the over-voltage/current to ground, thereby protecting the I/O circuitry.

18 Claims, 6 Drawing Sheets

BI-DIRECTIONAL ELECTROSTATIC DISCHARGE PROTECTION DEVICE FOR RADIO FREQUENCY CIRCUITS

FIELD OF THE INVENTION

The present disclosure relates to electrostatic discharge (ESD) protection, and particularly pertains to ESD protection devices utilized in radio frequency (RF) circuits.

BACKGROUND OF THE INVENTION

ESD protection devices are utilized on integrated circuits (ICs) to prevent damage caused by ESD events, which often involve high voltage (e.g., several kV) and high current stress (e.g., 1-10 A) transferred to a host IC by way of contact with a charged object. Although ESD events typically have very short durations (e.g., 0.2-200 ns), the ESD current/voltage pulses can produce irreparable damage to ICs.

Figure 7:
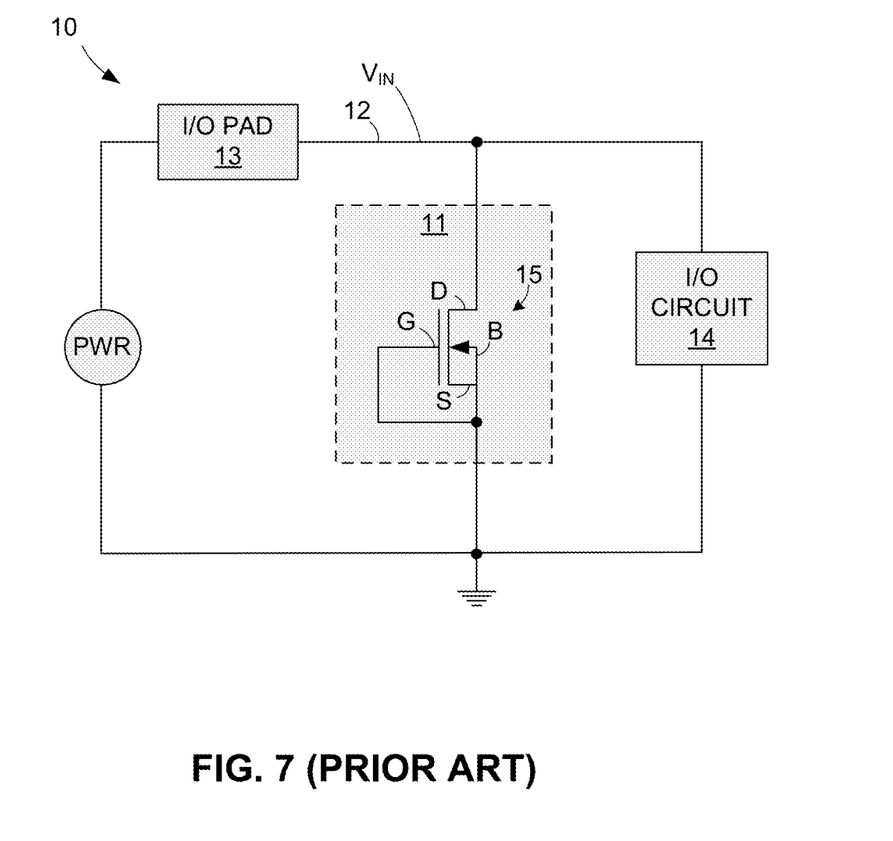
FIG. 7 is a simplified diagram showing a conventional IC and ESD protection device.

FIG. 7 depicts a simplified IC 10 including a conventional basic ESD protection device 11 that functions to protect IC 10 against ESD events. ESD protection circuit 11 is connected between a conductive signal path (wire) 12 and ground, where signal path 12 functions to pass signals between an input/output (I/O) pad 13 and an I/O circuit 14, which is turn is operably coupled to functional circuitry (not shown) of IC 10. IC 10 is typical designed and manufactured using an established semiconductor fabrication flow (e.g., CMOS) such that, while input signals $V_{IN}$ applied to I/O pad 13 are within the predetermined voltage and current ranges, ESD protection device 11 remains inactive (i.e., in a high impedance operating state), whereby input signals $V_{IN}$ are passed from conductive path 12 to I/O circuit 14, which in turn converts input signals $V_{IN}$ into data values that are then processed by the IC's functional circuitry. An ESD event occurs when a voltage potential is applied to I/O pad 13 that is outside (e.g., greater than) the predetermined voltage and/or current ranges. When such an ESD event occurs (i.e., when input voltage $V_{IN}$ on signal path 12 exceeds a predetermined "safe" voltage level), ESD protection device 11 activates by way of switching from its high-impedance state to a low-impedance state, thereby shunting the ESD voltage/current to ground, thus preventing damage to I/O circuit 14.

ESD protection device 11 (FIG. 7) is implemented using a conventional grounded-gate NMOS (ggNMOS) transistor 15, which represents a basic ESD protection device used in ICs. Conventional ggNMOS transistor 15 is similar to a normal NMOS transistor, but differs in that its gate G, its n-doped source S, and its p-doped body B are collectively connected to ground, with its n-doped drain ID connected to I/O pad 13 by way of signal path 12. In this configuration, ggNMOS transistor 15 functions as a parasitic NPN bipolar junction transistor (BJT) with n-doped drain D forming the BJT's collector, n-doped source S forming the BJT's emitter, and p-doped body B forming the BJT's base. A positive ESD event is generated on I/O pad 13 when input voltage $V_{IN}$ on signal path 12 exceeds the drain-to-source breakdown voltage $BV_{DSS}$, of ggNMOS transistor 15, producing a positive current flow from drain D to source S (i.e., electrons flow to source S and holes flow to body B), which in turn generates a positive body-to-source voltage ($V_{BS}$). Stated differently, using the above-mentioned parasitic NPN BJT analogy, the ESD event causes the collector-base junction to become reverse biased to the point of avalanche breakdown, whereby the positive current flowing from the base to ground induces a voltage potential across a parasitic resistor present between the emitter and base, which is produced by the finite conductivity of the p-doped body (substrate), causing a positive voltage to appear across the base-emitter junction. The positive base-emitter voltage forward biases this junction, triggering the parasitic NPN BJT, thereby shunting the ESD event to ground.

While conventional ggNMOS-type ESD protection device 11 was considered adequate for lower bandwidth IC circuits, for at least the following reasons they are inadequate for ICs configured to receive high-frequency, large amplitude input signals, such as the radio-frequency (RF) circuits utilized in modern communication devices (e.g., cellular telephones).

First, ggNMOS-type ESD protection device 11 provides unsymmetrical protection against positive ESD events. That is, as set forth above, ESD protection device 11 functions like a parasitic BJT when subjected to positive voltages, whereby it activates when subjected to positive voltages above the drain-to-source breakdown voltage ($BV_{DSS}$) of ggNMOS transistor 15, which is typically 5V for a single NMOS device. In contrast, when subjected to negative voltages, ggNMOS transistor 15 functions like a diode (i.e., the gate, source and body terminals form the diode's anode, and the drain terminal forming the diode's cathode), whereby ESD protection device 11 activates when subjected to negative voltages above the diode's threshold voltage, which is typically 0.7V. This unsymmetrical activation at positive and negative ESD events makes ESD protection device 11 unsuitable for RF circuits that require symmetric ESD protection.

Second, in order to achieve a high trigger voltage (e.g., 70V), ESD protection device 11 must be configured using multiple ggNMOS transistors in a stacked arrangement, thereby causing the resulting stacked ggNMOS device to generate a large nonlinear capacitive loading on signal line 12. This large nonlinear capacitive loading has a greater impact on the performance of RF ICs than on lower bandwidth IC circuits. Specifically, at high frequencies and large amplitudes, this nonlinearity degrades the signal integrity of the high performance mixed signal circuits, such as analog-to-digital converters (ADCs), which are utilized in the I/O circuitry of RF circuits.

Several ESD protection devices have been developed for RF circuits that address the nonlinear capacitance issues associated with ggNMOS-based ESD protection devices. One conventional approach taught in U.S. Pat. No. 9,627,883 (Muthukrishnan et al.) utilizes two large FET devices connected in series between a signal line and ground, with the gate and source terminals of the two FETs being coupled together by way of a resistor network. With this arrangement, in response to a positive ESD event one of the two large FETs turns on in response to a high or low trigger voltage, and the other large FET acts as a parasitic diode to shunt the ESD charge to ground. The roles of the two large FETs reverse in response to a negative ESD event, thereby providing bi-directional ESD protection. A problem with such prior art RF ESD protection devices is that the two large FETs and associated resistors occupy a large chip area, making them relatively expensive to manufacture, and generate significant capacitive loading that produces harmonic interference, especially at a second harmonic level, which impedes optimal operation of the host RF circuit. Moreover, many such prior art RF ESD protection devices provide relatively low immunity to false triggering.

What is needed is a ESD protection device for RF circuits that addresses the problems associated with the conventional ESD protection devices mentioned above. In particular, what is needed is an ESD protection device that exhibits symmetrical bi-directional protection from both positive and negative ESD events, exhibits high immunity to false triggering, introduces minimal parasitic capacitive loading on the host RF circuit (i.e., exhibits low harmonics), and is inexpensive to produce (i.e., occupies a relatively small chip area and easily produced using established RF circuit fabrication process flows).

SUMMARY OF THE INVENTION

The present invention is directed to an ESD protection device that utilizes a main NMOS transistor and an associated pre-driver circuit to achieve symmetrical, bi-directional protection against both positive and negative ESD events in a manner suitable for high input voltage RF circuit applications using substantially less chip area than that required by conventional two-FET solutions. The main transistor is configured and functions in a manner similar to a conventional ggNMOS, but differs in that the gate/body control voltage applied to a main gate terminal and body region of the main transistor is controlled by the pre-driver circuit such that the gate/body control voltage changes according to the positive/negative voltage level of the input signal. The pre-driver circuit controls the gate/body control voltage applied to the main transistor using two small pre-driver FETs that are connected between the source and drain terminals of the main transistor, and are configured to apply the lower of the source and drain voltages to the main gate terminal and the body region of the main transistor during positive and negative input signal phases. Specifically, one of the two pre-driver FETs activates to couple the main gate terminal and the body region to the lower voltage (e.g., 0V) present on the main transistor's source terminal during positive input signal phases (i.e., when the voltage level applied to the main transistor's drain terminal is positive relative to ground), and the second pre-driver FET activates to couple the main gate terminal and the body region to the lower voltage present on the main transistor's drain terminal during negative input signal phases (i.e., when the voltage level applied to the main transistor's drain terminal is negative relative to ground). This arrangement functions similar to a conventional ggNMOS-based ESD device during positive voltage phases, whereby when a positive ESD event arises (e.g., when the input signal reaches a positive voltage level that is higher than the source-drain breakdown voltage of the main transistor), the main transistor forward biases (turns on) to discharge the positive ESD voltage to ground. However, by configuring the pre-driver circuit in the manner described above, the present invention provides symmetric bi-directional ESD protection by way of causing the main transistor to also discharge at comparable negative ESD events (i.e., at negative voltage levels having magnitudes substantially equal to the than the negative trigger voltage of the main transistor), whereby damage due to the negative ESD event is also prevented. In addition, utilizing the pre-driver FETs in this manner maximizes the gate-source breakdown voltage of the main transistor, which provides the ESD protection device with high immunity to false triggering and reduces parasitic loading by way of reliably preventing current through the main transistor in the absence of an ESD event. Moreover, the novel ESD protection devices of the present invention occupy substantially smaller chip areas than comparable conventional RF ESD protection circuits, and only comprise elements that are implemented using conventional fabrication processes, whereby the novel ESD protection devices have lower overall manufacturing costs than conventional RF ESD protection circuits.

According to presently preferred embodiments of the present invention, the ESD protection device is configured to efficiently facilitate large (i.e., greater than 5V) trigger voltages by way of providing two or more series-connected stages between the antenna transmission path and ground, with each stage includes both a main transistor and an associated pre-driver circuit. The stacking arrangement is configured such that the main transistor in each stage is connected in series with the main transistors of all other stages between the antenna transmission path and ground, whereby the trigger voltage of a given ESD protection device is determined by the sum of the drain-to-source breakdown voltages of the series-connected main transistors, which in turn in determined by the number of stages implemented in the given ESD protection device. In addition, the stacking arrangement is configured such that the gate voltage applied to each main transistor is controlled in the manner described above by an associated pre-driver circuit, whereby the drain-to-source breakdown voltage of the series-connected main transistor in each of the series-connected stage is maximized (e.g., 5V), thereby allowing the stacked arrangement to achieve relatively high trigger voltages using a relatively small number of stages, which in turn reduces capacitive loading of the ESD protection device on the host RF transmission path. That is, because the pre-driver configuration maximizes the drain-to-source breakdown voltage of each stacked main transistor, the present invention facilitates a selected high trigger voltages using a minimum number of stacked FETs (i.e., main transistors), which in turn minimizes parasitic loading on the host RF circuit, resulting in lower harmonic interference that enhances the operating quality of the host RF circuit. Moreover, the reduced-space configuration mentioned above applies to each stage, whereby ESD protection devices of the present invention that are configured for large trigger voltages (e.g., 60V or higher) occupy substantially smaller chip-area space (i.e., approximately 33%) than that required by conventional two-FET solutions.

According to alternative specific embodiments, ESD protection circuits of the present invention are implemented in a variety of RF circuit types (e.g., RF switch circuitry and front end circuitry).

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in ESD protection for RF circuits. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
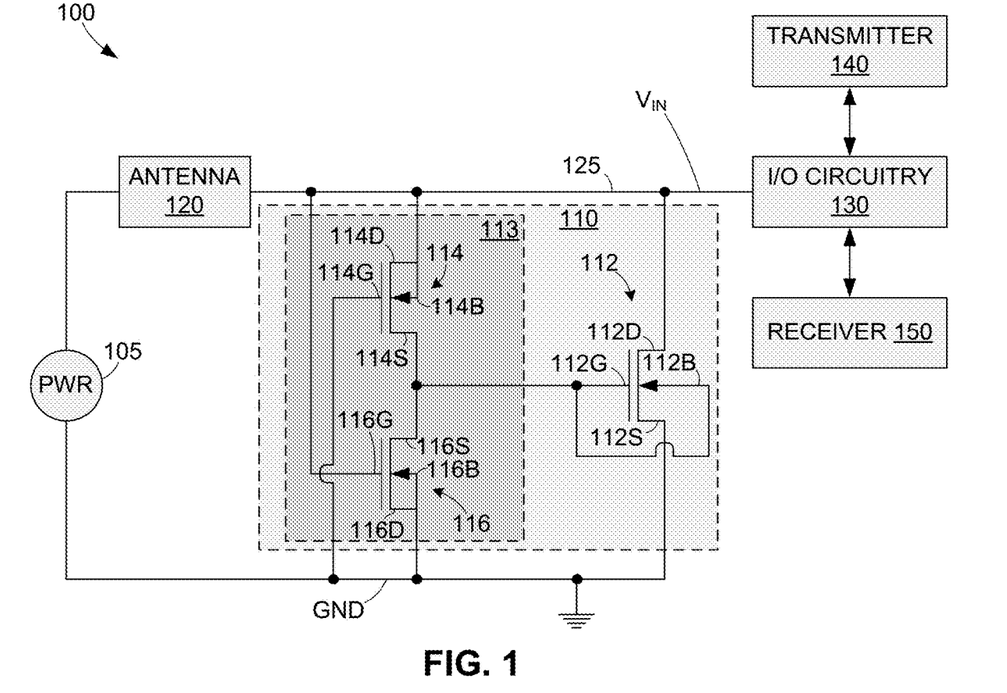
FIG. 1 is a circuit diagram depicting a simplified RF circuit including a generalized ESD protection device of the present invention.

FIG. 1 depicts a basic RF circuit 100 including a generalized ESD protection device 110 of the present invention. RF circuit 100 also includes an antenna 120 that is coupled by way of a signal path (transmission line) 125 to input/output (I/O) circuitry 130, which in turn is coupled to a transmitter circuit 140 and a receiver circuit 150. In a receive mode of operation, antenna 120 receives information bearing radio frequency signals from one or more remote transmitters that are delivered to I/O circuit 130 as input signal $V_{IN}$ by way of signal path 125. I/O circuit 130 filters input signal $V_{IN}$, and utilizes analog-to-digital circuitry to convert the filtered signal into one or more digital data streams that are then passed to receiver 150 for processing. In a transmission mode, digitized data, which may represent voice, data, or control information, is encoded for transmission by transmitter 140, converted to a radio frequency signal by I/O circuit 130, and then passed by way of signal line 125 to antenna 120 for transmission. Control of RF circuit 100 is implemented by way of known interface systems (not shown), such as a microphone, a keypad, or a touch-screen display. Those skilled in the art will understand that RF circuit 100 depicted in FIG. 1 omits, for the sake of brevity and clarity, various optional and non-optional circuit structures typically found on an RF circuit (e.g., switching circuitry, diplexers, power amplifiers, baseband processors, digital signal processors (DSPs), and frequency synthesizers).

Referring to the center of FIG. 1, ESD protection device 110 is connected between transmission path 125 and a ground potential (e.g., $V_{SS}$ or 0V), and includes at least one main transistor 112 and an associated pre-driver circuit 113. In a preferred embodiment, main transistor 112 is an NMOS transistor including a drain (first) terminal 112D and a source (second) terminal 112S that are respectively coupled to transmission path 125 and ground potential GND, and includes a body region 112B and a (main) gate terminal 112G that are connected together and to a source node S. In the simplified embodiment shown in FIG. 1, drain terminal 112D is connected to transmission path 125 and source terminal 112S is connected to ground potential GND, but in most practical embodiments one or more intervening stages (described below with reference to FIGS. 4(A) and 4(B)) are disposed between at least one of drain terminal 112D and transmission path 125, or source terminal 112S and ground potential GND. In one embodiment, main transistor 112 is configured and fabricated using techniques similar to those utilized in the fabrication of conventional ggNMOS devices, but main transistor 112 differs from conventional ggNMOS devices in that main gate terminal 112G and body region 112B are controlled by a signal present on a source node S, where the signal on source node S is selectively changed by pre-driver circuit 113 in the manner described below. That is, unlike conventional ggNMOS devices, in which the gate/body are maintained at a fixed (unchanging) potential (e.g., 0V) due to the fixed gate/body-to-ground connection, the control voltage applied from source node S to main gate terminal 112G and body region 112B of main transistor 112 changes in accordance with the positive potential (i.e., greater than 0V) or negative potential (i.e., less than 0V) of input signal $V_{IN}$.

Pre-driver circuit 113 is connected in parallel between drain terminal 112D and source terminal 112S of main transistor 113 (e.g., between transmission path 125 and ground potential GND), and includes a first field effect transistor (FET) 114 and a second FET 116. First pre-driver FET 114 includes a drain terminal 114D connected to drain terminal 112D, a source terminal 114S connected to main gate terminal 112G, and a gate terminal 114G connected to source terminal 112S. Second pre-driver FET 116 includes a drain terminal 116D connected to source terminal 112S, a source terminal 116S connected to main gate 112G, and a second gate terminal 116G connected to the first drain terminal 112D of the main transistor 112D.

As explained in additional detail below, pre-driver circuit 113 is configured to change the gate/body potential applied to main transistor 112 by way of alternately actuating (turning on) pre-driver FETs 114 and 116 during positive and negative voltage input signal phases, respectively, thereby alternately coupling source node S to ground (during positive voltage input signal phases) and transmission path 125 (during negative voltage input signal phases). Specifically, pre-driver FET 116 is configured to turn on during positive voltage input signal phases (i.e., when a voltage level/potential on drain terminal 112D is greater than a voltage level/potential on source terminal 112S), thereby coupling source node S to the lower potential present on source terminal 112S (e.g., ground/0V), and pre-driver FET 114 is configured to turn on during negative voltage input signal phases (i.e., when the potential on drain terminal 112D is less than the potential on source terminal 112S), thereby coupling source node S to drain terminal 112D (e.g., $V_{IN}$, which is lower than 0V during negative voltage input signal phases). Note that this configuration also causes main transistor 112 to function as a symmetric bidirectional parasitic NPN BJT that forward-biases (turns on to conduct current from transmission line 125 to ground) at a positive trigger voltage $V_{t1+}$ (e.g., the drain-to-source breakdown voltage, which is typically +5V for symmetric NMOS transistors), and reverse-biases (turns on to conduct current from ground to transmission line 125) at a negative trigger voltage $V_{t1-}$ (e.g., the source-to-drain breakdown voltage, which is also typically +5V for symmetric NMOS transistors). In other words, n-doped drain terminal 112D serves as a collector of the bidirectional parasitic NPN BJT during positive phases and as an emitter of the bidirectional parasitic NPN BJT during negative phases, n-doped source terminal 112S serves as the emitter during positive phases and as the collector during negative phases, and p-doped body 112B forms the bidirectional parasitic NPN BJT's base during both positive and negative phases). Accordingly, unlike conventional ggNMOS-based ESD devices, ESD protection circuit 110 provides symmetric bi-directional protection that is suitable for RF circuit applications.

According to a preferred embodiment of the present invention, pre-driver FET 114 and pre-driver FET 116 are fabricated as small NMOS transistors having widths that are substantially smaller than that of main transistor 112, but the total area occupied by pre-driver circuit 113 and main transistor 112 is substantially smaller than that required by conventional two-FET ESD protection devices. In an exemplary embodiment, each pre-driver FET comprises a single finger having a width of 10 microns and a length of 280 nm, and main transistor 112 comprises 44 fingers, each having a width of 15 microns (i.e., a total width of 660 µm) and lengths of 400 nm. In comparison, conventional two-FET ESD protection devices require two FETs each having widths of approximately 2000 µm or more. By fabricating ESD protection circuit 110 using the configuration described herein, the synergistic combination of main transistor 112 and pre-driver circuit 113 facilitates reliable symmetric bi-directional ESD protection using substantially less chip area than that required by conventional two-FET ESD protection devices.

Figure 2:
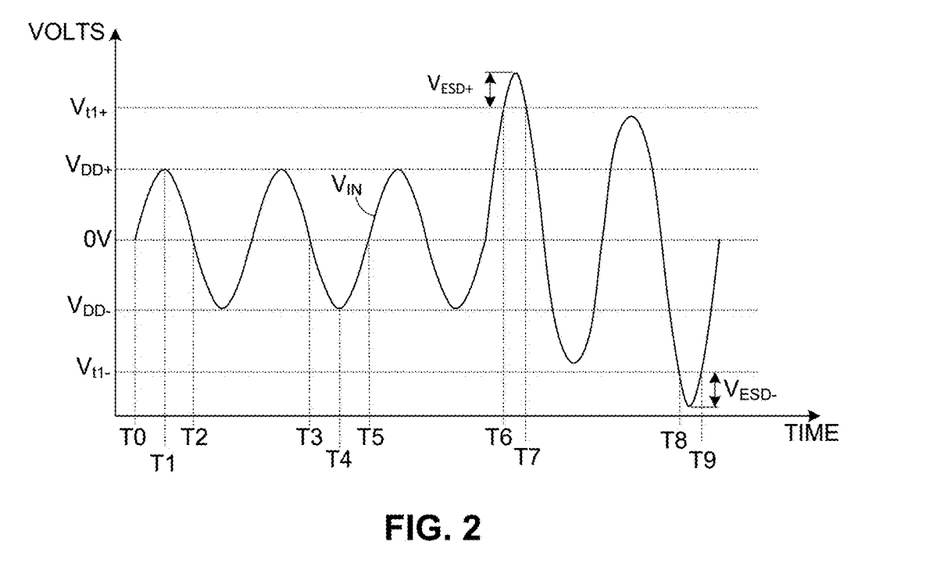
FIG. 2 is a diagram depicting an exemplary input signal applied to the RF circuit of FIG. 1.

FIG. 2 includes a graph depicting exemplary input voltages $V_{IN}$ that are referenced in the following discussion. As mentioned above, input signal $V_{IN}$ includes voltage levels applied to transmission path 125 by way of antenna 120 during operation of RF circuit 100. As used herein, references to "positive voltage input signal phase" refer to time periods during which input voltage $V_{IN}$ applied to transmission path 125 is above 0V. For example, referring to the left side of FIG. 2, input voltage $V_{IN}$ is depicted in a positive voltage input signal phase between times T0 and T2. Conversely, references to "negative voltage input signal phase" herein refer to time periods during which input voltage $V_{IN}$ applied to transmission path 125 is less than 0V (e.g., input voltage $V_{IN}$ is depicted in a negative voltage input signal phase between times T3 and T5).

FIG. 2 also depicts both normal operations and exemplary positive and negative ESD events that result in the actuation of ESD protection circuit 110 in the manner described below with reference to FIGS. 3(C) and 3(D). RF circuit 100 operates normally when input signal $V_{IN}$ remains within a specified voltage range (e.g., between voltages $V_{DD+}$ and $V_{DD-}$ in FIG. 2). In FIG. 2, such normal operating voltage ranges of input signal $V_{IN}$ are depicted, for example, between times T0 and T5 because the peak positive voltage levels during this period (e.g., at time T2) are equal to or below $V_{DD+}$, and the peak negative voltage levels during this period (e.g., at time T4) are equal to or above $V_{DD-}$. A positive ESD event occurs when the magnitude of input signal $V_{IN}$ exceeds either a positive trigger voltage $V_{t1+}$ or a negative trigger voltage $V_{t1-}$, which are respectively preferably above $V_{DD+}$ and below $V_{DD-}$, as depicted in FIG. 2. That is, a positive ESD event occurs during periods (e.g., between times T6 and T7 in FIG. 2) when the amplitude of input signal $V_{IN}$ exceeds positive trigger voltage $V_{t1+}$, and a negative ESD event occurs during periods (e.g., between times T8 and T9 in FIG. 2) when the amplitude of input signal $V_{IN}$ drops below negative trigger voltage $V_{t1-}$. Note that exemplary voltage signals VIN shown in FIG. 2 are simplified for illustrative purposes, and that the actual voltages generated on transmission line 125 are pulled to a low voltage during ESD events.

FIGS. 3(A) to 3(D) depict the operation of ESD protection circuit 110 during normal and ESD event operating conditions in additional detail.

Figure 3A:
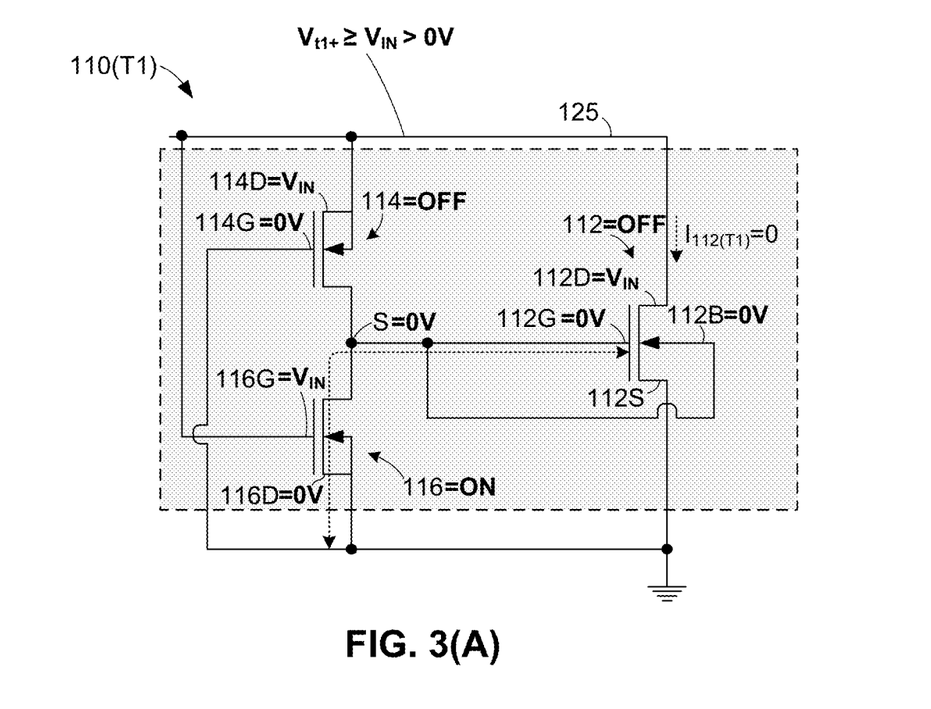
FIGS. 3(A), 3(B), 3(C) and 3(D) are diagrams indicating operating states of the ESD protection device of FIG. 1 in response to associated input voltage levels.

FIG. 3(A) depicts ESD protection circuit 110 during each positive voltage input signal phase, such as the phase depicted in FIG. 2 between times T0 and T2, when the amplitude of input signal $V_{IN}$ is between 0V and positive trigger voltage $V_{t1+}$. As set forth above, input signal $V_{IN}$ is passed from transmission line 125 to gate terminal 116G of pre-driver FET 116, and the ground potential (0V) is applied to the gate terminal 114G of pre-driver FET 114. Assuming input signal $V_{IN}$ is sufficiently positive (e.g., between about 0.5V and positive trigger voltage $V_{t1+}$) during the positive voltage input signal phase, gate terminal 116G has a positive voltage relative to drain terminal 116D, whereby the resulting positive gate-to-drain voltage turns on pre-driver FET 116 such that source node S is coupled to ground (0V). Conversely, gate terminal 114G has a negative voltage relative to drain terminal 114D, whereby the resulting negative gate-to-drain voltage turns off pre-driver FET 114, thereby isolating source node S from transmission path 125. The 0V generated on source node S is applied to main gate terminal 112G and body region 112B of main transistor 112, whose drain terminal 112D receives positive input voltage $V_{IN}$ and whose source terminal 112S is maintained at ground (0V). Because the resulting drain-to-gate voltage $V_{DG}$ is less than the positive trigger voltage $V_{t1+}$ (i.e., the drain-to-source breakdown voltage $BV_{DSS}$ of main transistor 112), main transistor 112 remains turned off, whereby ESD protection circuit 110 maintains a high impedance (i.e., current $I_{112(T1)}$ through main transistor 112 is essentially zero), and input signal $V_{IN}$ is passed on transmission path 125 to an I/O circuit (not shown).

Figure 3B:
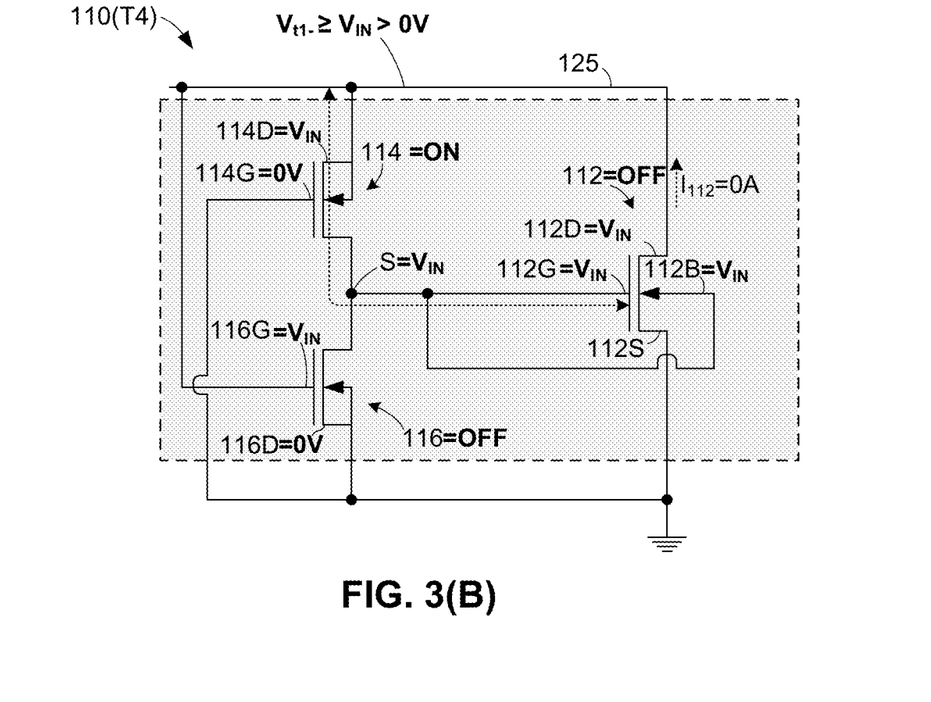

FIG. 3(B) depicts ESD protection circuit 110 during a negative voltage input signal phase, such as that depicted in FIG. 2 between times T3 and T5, when the amplitude of input signal $V_{IN}$ is between 0V and negative trigger voltage $V_{t1-}$. In this case, the negative input signal $V_{IN}$ causes the voltage at gate terminal 116G to be negative relative to the voltage on drain terminal 116D (i.e., because $V_{IN}$ is less than 0V), whereby the resulting negative gate-to-drain voltage turns off pre-driver FET 116, thereby isolating source node S from ground. Conversely, the 0V applied to gate terminal 114G generates a positive gate-to-drain voltage (i.e., because $V_{IN}$ on drain 114D is lower than 0V), whereby pre-driver FET 114 is turned on, thereby coupling source node S to transmission path 125. The sub-0V potential (i.e., input signal $V_{IN}$) generated on source node S is applied to main gate terminal 112G and body region 112B of main transistor 112, whose drain terminal 112D receives negative input voltage $V_{IN}$ and whose source terminal 112S is maintained at the relatively positive ground potential (i.e., 0V). Because the resulting source-to-gate voltage $V_{SG}$ is less than negative trigger voltage $V_{t1-}$, main transistor 112 remains turned off, whereby ESD protection circuit 110 maintains a high impedance (i.e., current $I_{112(T4)}$ through main transistor 112 is essentially zero), and input signal $V_{IN}$ is passed on transmission path 125 to an I/O circuit (not shown).

Figure 3C:
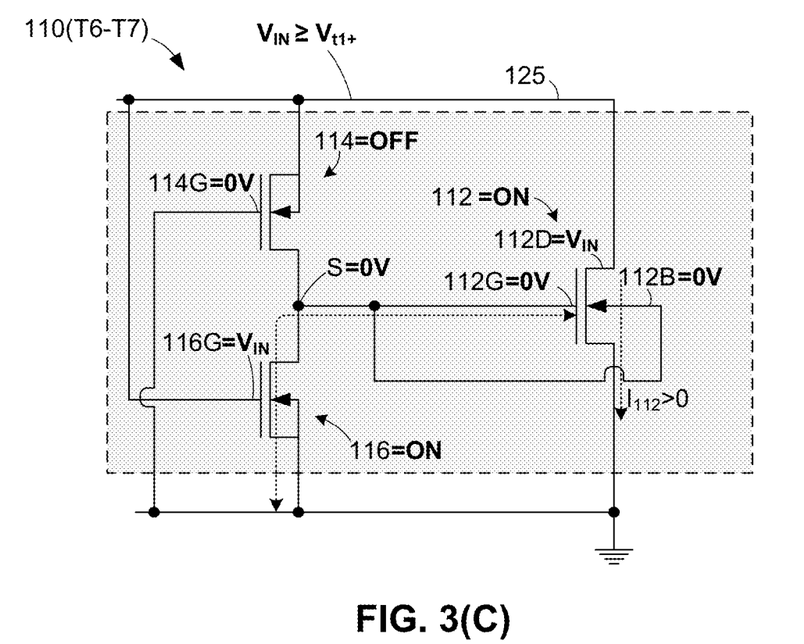

FIG. 3(C) depicts ESD protection circuit 110 during the positive voltage ESD event, such as when input signal $V_{IN}$ rises to/above positive trigger voltage $V_{t1+}$ (e.g., at a voltage depicted in FIG. 2 between times T6 and T7). Because input signal $V_{IN}$ is positive, gate terminal 116G is positive relative to drain terminal 116D, whereby pre-driver FET 116 is turned on and source node S is coupled to ground (gate terminal 114G is negative voltage relative to drain terminal 114D, whereby pre-driver FET 114 is turned off). The 0V generated on source node S is applied to main gate terminal 112G and body region 112B of main transistor 112, whose drain terminal 112D receives positive input voltage $V_{IN}$ and whose source terminal 112S is maintained at ground (0V). Because input voltage $V_{IN}$ is greater than positive trigger voltage $V_{t1+}$, which is equal to the drain-source breakdown voltage $BV_{DSS}$, main transistor 112 turns on and transmits current from transmission path 125 to ground, whereby ESD protection circuit 110 actuates to pull voltage on transmission line 125 below positive trigger voltage $V_{t1+}$ (i.e., to 0V). Stated differently, using the above-mentioned parasitic NPN BJT analogy, the positive ESD event causes the collector-base (i.e., drain terminal 112D to body region 112B) junction to become reverse biased to the point of avalanche breakdown, whereby the positive current flowing from the base (body region 112B) to ground induces a voltage potential across a parasitic resistor present between the emitter (source terminal 112S) and base (body region 112B), which is produced by the finite conductivity of the p-doped body region (substrate), causing a positive voltage to appear across the base-emitter junction. The positive base-emitter voltage forward biases this junction, triggering the parasitic NPN BJT, thereby shunting the ESD event to ground. Note that when input voltage $V_{IN}$ again drops below positive trigger voltage $V_{t1+}$ (e.g., after time T7), main transistor 112 turns off again, and RF circuit 100 returns to normal operation.

Figure 3D:
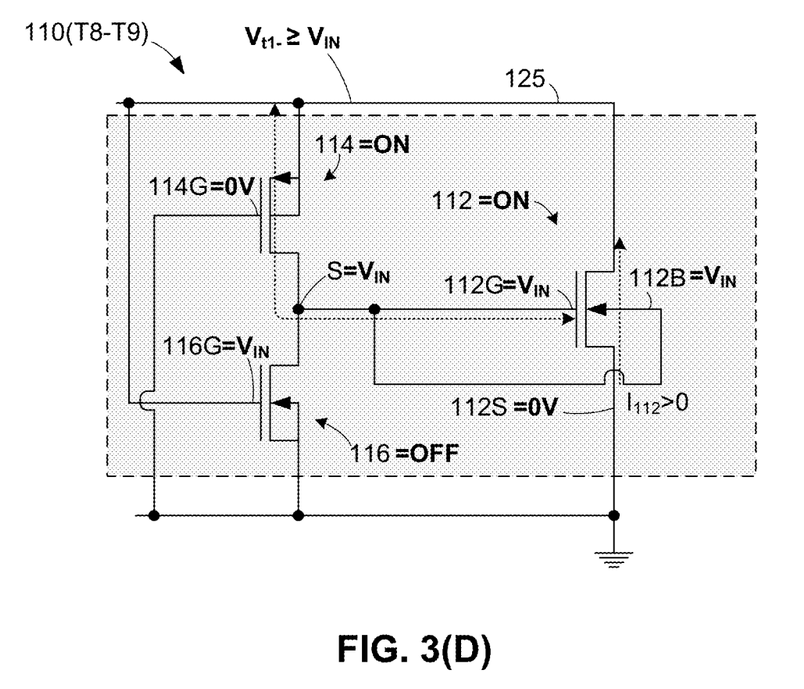

FIG. 3(D) depicts ESD protection circuit 110 during the negative voltage ESD event, such as when input signal $V_{IN}$ falls below negative trigger voltage $V_{t1-}$ (e.g., at a voltage depicted in FIG. 2 between times T8 and T9). Because input signal $V_{IN}$ is negative, gate terminal 114G is positive relative to drain terminal 114D, whereby pre-driver FET 114 is turned on and source node S is coupled to transmission line 125 (gate terminal 116G is negative relative to drain terminal 116D, whereby pre-driver FET 116 is turned off). The sub-0V input signal $V_{IN}$ generated on source node S is applied to main gate terminal 112G and body region 112B of main transistor 112, whose drain terminal 112D receives negative input voltage $V_{IN}$ and whose source terminal 112S is maintained at ground (0V). Because input voltage $V_{IN}$ is lower than negative trigger voltage $V_{t1+}$, which is equal to the source-drain breakdown voltage $V_{G1}$, main transistor 112 turns on and transmits current from ground to transmission line 125, whereby ESD protection circuit 110 actuates to maintain the voltage on transmission line 125 at or above negative trigger voltage $V_{t1-}$ during time period T8 to T9. Stated differently, using the above-mentioned parasitic NPN BJT analogy, the negative ESD event causes the collector-base (i.e., source terminal 112S to body region 112B) junction to become reverse biased to the point of avalanche breakdown, whereby the negative current flowing from the base (body region 112B) to transmission line 125 induces a voltage potential across a parasitic resistor present between the emitter (drain terminal 112D) and base (body region 112B), which is produced by the finite conductivity of the p-doped body region, thereby shunting the ESD event to transmission line 125. Note that when input voltage $V_{IN}$ again rises above negative trigger voltage $V_{t1-}$ (e.g., after time T9), main transistor 112 turns off again, and RF circuit 100 returns to normal operation.

As set forth in the examples above, ESD protection device 110 provides several benefits over conventional ESD protection devices. In contrast to conventional ggNMOS devices, ESD protection device 110 provides symmetric bi-directional protection that is required in RF circuits by way of protecting against both positive and negative ESD events of equal magnitude. In contrast to conventional RF ESD approaches, pre-driver FETs 114 and 116 function to reliably maintain gate terminal 112G of main transistor 112 at the lowest operating voltage (e.g., 0V during positive voltage phases and at $V_{IN}$ during negative voltage phases), which minimizes the gate-source breakdown voltage ($BV_{GS}$) of main transistor 112, thereby providing ESD protection circuit 110 with high immunity to false triggering. Further, because main transistor 112 remains reliably turned off during normal operation, ESD protection device reduces parasitic loading and signal degradation that are common with conventional RF ESD protection approaches. In contrast, prior art RF approaches are often RC triggered, which causes the main transistors to turn on during fast switching, which can also generate harmonic issues.

Figure 4A:
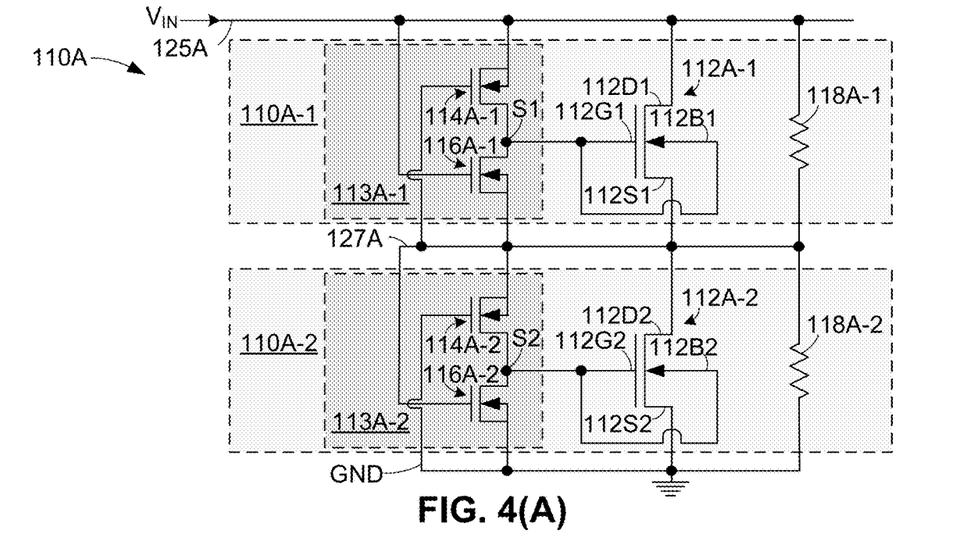
FIGS. 4(A) and 4(B) are circuit diagrams depicting ESD protection devices according to alternative embodiments of the present invention.
Figure 4B:
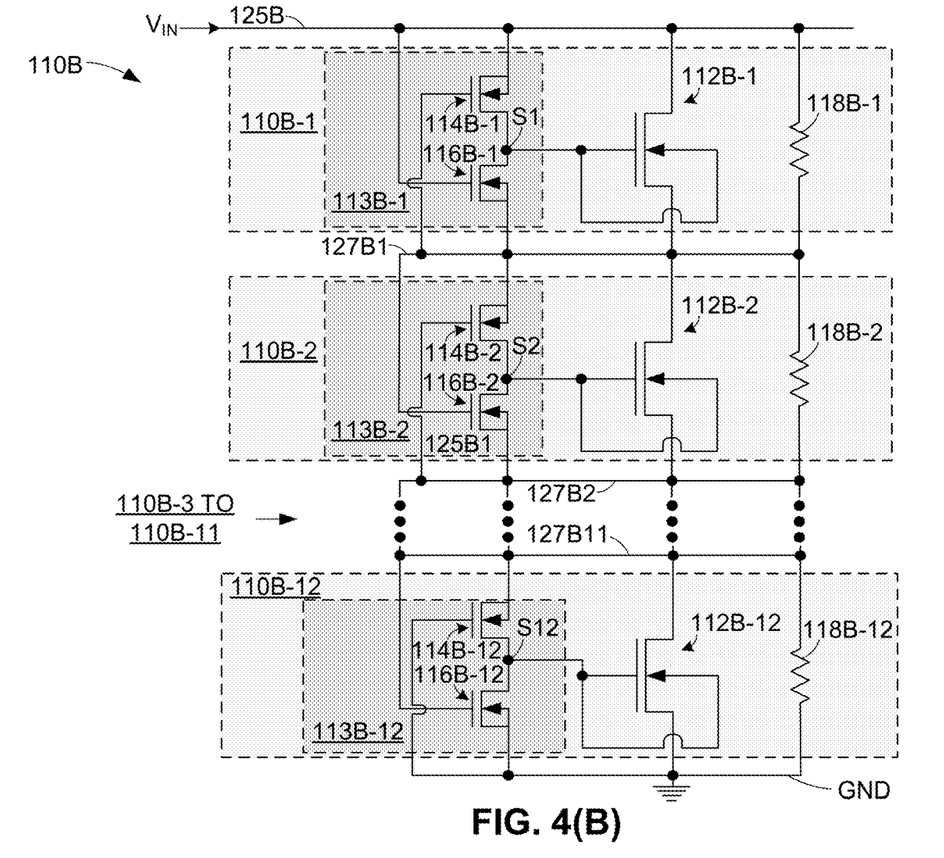

FIGS. 4(A) and 4(B) are circuit diagrams depicting ESD protection devices 110A and 110B according to exemplary alternative embodiments of the present invention.

ESD protection devices 110A and 110B differ from the single-stage ESD protection device 110 (described above) in that each device 110A and 110B includes two or more series-connected (stacked) stages, where each stage includes a main transistor and an associated pre-driver circuit configured as described above. For example, referring to FIG. 4(A), ESD protection device 110A includes a first stage 110A-1 and a second stage 110A-2 that are connected in series between transmission path 125A and ground potential GND, where stage 110A-1 includes main transistor 112A-1 and associated pre-driver circuit 113A-1, and stage 110A-2 includes main transistor 112A-2 and associated pre-driver circuit 113A-2. Similarly, referring to FIG. 4(B), ESD protection device 110B includes a first stage 110B-1 and a second stage 110B-2 connected in series between transmission path 125B and ground potential GND, where ESD protection device 110B also includes additional third through eleventh stages 110B-3 to 110B-11 (not shown) and a twelve stage 112B-12 that are connected in series between second stage 110B-2 and ground potential GND.

According to an aspect of the invention, each adjacent pair of series-connected stages is connected by way of an intervening inter-stage node such that the main transistors of all of the stages are connected in series by way of the inter-stage nodes, and such that the pre-driver circuit of each stage is connected between the source and drain terminals of its associated main transistor by way of at least one inter-stage node. For example, referring to FIG. 4(A), main transistor 112A-1 of stage 110A-1 includes a drain terminal 112D2 connected to transmission path 125A and a source terminal 112S2 connected to a first inter-stage node 127A, and main transistor 112A-2 of stage 110A-2 includes a drain terminal 112D2 connected to inter-stage node 127A and a source terminal 112S2 connected to ground potential GND. Also in FIG. 4(A), pre-driver circuit 113A-1 of stage 110A-1 includes pre-driver FETs 114A-1 and 116A-1 respectively controlled by voltages on inter-stage node 127A and transmission path 125A, and are connected between a source node S1 (which is connected to main gate terminal 112G1 and body region 112B1 of main transistor 112A-1) and transmission path 125A and inter-stage node 127A, respectively, and pre-driver circuit 113A-2 of stage 110A-2 includes pre-driver FETs 114A-2 and 116A-2 connected between a source node S2 (which is connected to main gate terminal 112G2 and body region 112B2 of main transistor 112A-2) and inter-stage node and ground potential GND, respectively. Referring to FIG. 4(B), main transistor 112B-1 of stage 110B-1 is connected between transmission path 125B and a first inter-stage node 127B1, and main transistor 112B-1 of stage 110B-2 is connected between inter-stage node 127B1 and a second inter-stage node 127B2, where the lower end of the stacked arrangement in FIG. 4(B) ends with main transistor 112B-12 of stage 110B-12 connected between an eleventh inter-stage node 127B11 and ground potential GND. Similarly, pre-driver circuit 113B-1 of stage 110B-1 includes pre-driver FETs 114B-1 and 116B-1 connected between a source node S1 and transmission path 125B and inter-stage node 127B1, respectively, pre-driver circuit 113B-2 of stage 110B-2 includes pre-driver FETs 114B-2 and 116B-2 connected between a source node S2 and inter-stage nodes 127B1 and 127B2, respectively, and pre-driver circuit 113B-12 of stage 110B-12 includes pre-driver FETs 114B-12 and 116B-12 connected between a source node S12 and inter-stage node 127B12 and ground potential GND, respectively.

As set forth above, the trigger voltage of ESD protection device 110 (FIG. 1) is determined by the drain-source breakdown voltage ($BV_{DSS}$) of main transistor 112 (e.g., 5V). According to an aspect of the invention indicated by the exemplary embodiments shown in FIGS. 4(A) and 4(B), ESD protection devices 110A and 110B are configured to implement trigger voltages larger than that implemented by the single-stage embodiment (i.e., FIG. 1) by way of stacking an associated number of series-connected (stacked) stages. For example, ESD protection device 110A is configured to operate as described above with reference to FIGS. 3(A) to 3(D), where the trigger voltage that causes the discharge operations depicted in FIGS. 3(C) and 3(D) is 10V (i.e., two times the $BV_{DSS}$ of main transistors 112A-1 and 112A-2, each being 5V). For example, when RF input signal voltages that vary between +9V and −9V are generated on antenna transmission path 125A, the input signal voltages are divided equally by stages 110A-1 and 110A-2 (i.e., approximately ±4.5V maximum potentials are generated across each of stage 110A-1 and stage 110A-2). Conversely, when RF input signal voltages that exceed either +10V or −9V are generated on antenna transmission path 125A, these ESD events cause both series-connected main transistors 112A-1 and 112A-2 to turn on due to the >5V potential across each main transistor. Similarly, ESD protection device 110B is configured to implement a trigger voltage of 60V (i.e., due to the sum of the $BV_{DSS}$ values for series-connected main transistors 112B-1 to 112B-12). Those skilled in the art will recognize that the stacking arrangement facilitates implementing trigger voltages of any desired voltage level by way of forming an associated ESD protection circuit having a suitable number of stages.

Referring to the right sides of FIGS. 4(A) and 4(B), ESD protection circuits 110A and 110B also includes one or more optional resistors that are connected in parallel with the main transistor in each stage. For example, in ESD protection circuit 110A (FIG. 4(A)), stage 110A-1 includes a resistor 118A-1 connected between transmission path 125A and inter-stage node 127A, and stage 110A-2 includes a resistor 118A-2 connected between inter-stage node 127A and ground potential GND. Similarly, ESD protection circuit 110B (FIG. 4(A)) includes resistors 118B-1, 118B-2 and 118B-12 connected in parallel between main transistors 112B-1, 112B-2 and 112B-12, respectively. The function of these resistors is to balance the voltage across each of the main transistors for reasons understood in the art. An exemplary nominal resistance value of each resistor is 1 MΩ (mega-ohm), although this nominal value may differ size of these resistors may vary.

Figure 5:
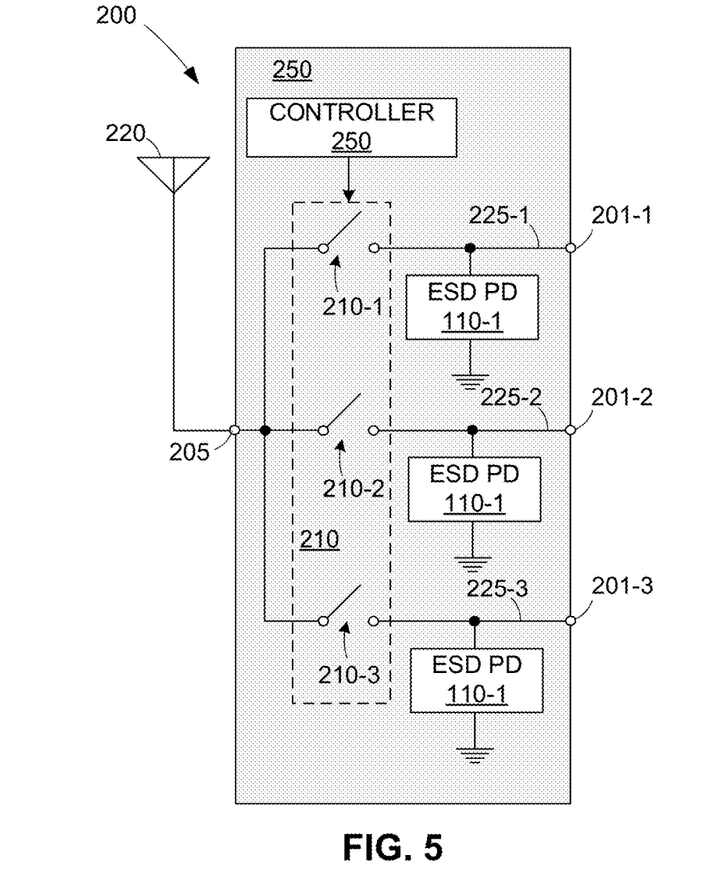
FIG. 5 is a simplified diagram depicting a switching circuit including the ESD protection device of FIG. 1 or 4 according to an alternative embodiment of the present invention.

FIG. 5 depicts a generalized antenna switching circuit 200 including three ESD protection devices 110-1, 110-2 and 110-3, each configured according to one of the embodiments set forth above. Antenna switching circuit 200 also includes three communication ports 201-1, 201-2 and 201-3, an antenna port 205, a switch array 210 including switches 210-1, 210-2 and 210-3, and a switch control circuit (controller) 250. For simplicity, other switch components (e.g., a diplexer) are omitted from FIG. 5. A control circuit 250 controls switch array 210 such that one of communication ports 201-1, 201-2 and 201-3 is selectively coupled to antenna port 205 at a given time by way of transmission (signal) paths 225-1, 225-2 and 225-3, respectively. In the disclosed embodiment, ESP protection devices 110-1, 110-2 and 110-3 are respectively connected between a ground potential and associated transmission paths 225-1, 225-2 and 225-3, respectively, and function as described above to form substantially low impedance paths to ground during ESD events in order to divert ESD voltages/currents away from antenna switching circuit 200 to ground, while maintaining a substantially high impedance at all other times in order to minimize signal loss.

Although switching circuit 200 is depicted as a single pole triple throw (SP3T) switch, antenna switching circuit 200 may comprise any number of switches, including any number of poles and throws, without departing from the spirit of the present invention. Moreover, although FIG. 5 depicts three ESD protection devices coupled to associated transmission paths, other configurations are possible. For example, a single ESD protection device may be utilized, or two ESD protection devices may be implemented. Similarly, in embodiments where more than three switches are utilized, one ESD protection device may be provided for each switch.

Figure 6:
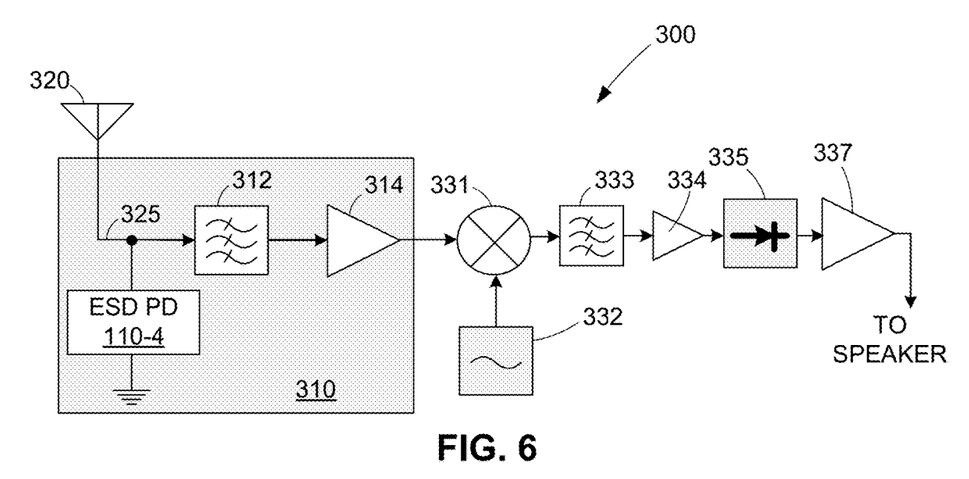
FIG. 6 is a simplified diagram depicting a front end circuit including the ESD protection device of FIG. 1 or 4 according to an alternative embodiment of the present invention.

FIG. 6 depicts another RF circuit 300 in which an ESD device 110-4 is connected to a signal line 325 that passes between an antenna 320 and a generalized front end circuit 310. In particular, RF circuit 300 is a radio receiver circuit, and front end circuit 310 includes an RF filter 312 and an RF amplifier 314 that are utilized to process signals passed from antenna 320 and a mixer stage 331 (i.e., before the incoming signal is converted to a lower intermediate frequency (IF) by a mixer 331, which mixes the input signal with the output from a local oscillator 332, and passes the mixed signal to a demodulator 335 by way of an IF amplifier 333, 334, and then through a final amplifier 337 to an output device (e.g., a speaker). In microwave and satellite receivers it is often called the low-noise block (LNB) or low-noise downconverter (LND) and is often located at the antenna, so that the signal from the antenna can be transferred to the rest of the receiver at the more easily handled intermediate frequency.

Although the present invention has been described with respect to certain specific embodiments, it will be clear to those skilled in the art that the inventive features of the present invention are applicable to other embodiments as well, all of which are intended to fall within the scope of the present invention.

The invention claimed is:
1. A radio frequency (RF) circuit configured to transmit input signals between an antenna and at least one of a transmitter circuit and a receiver circuit by way of a transmission path, wherein the RF circuit includes an ESD protection device connected between the transmission path and a ground potential, wherein the ESD protection device comprises:
  a main transistor having a first terminal coupled to the transmission path, a second terminal coupled to said ground potential, a main body region, and a main gate terminal connected to the main body region;
  a pre-driver circuit connected in parallel with the main transistor, the pre-driver circuit including:
    a first field effect transistor (FET) having a first drain terminal and a first body terminal connected to the first terminal of the main transistor, a first source terminal connected to the main gate terminal of the main transistor, and a first gate terminal connected to the second terminal of the main transistor, whereby the first FET turns on to couple the main gate terminal and the main body terminal to the first terminal when a first potential on the first terminal is greater than a second potential on the second terminal;
    a second FET having a second drain terminal and a second body terminal connected to the second terminal of the main transistor, a second source terminal connected to said main gate terminal, and a second gate terminal connected to the first terminal of the main transistor, whereby the second FET turns on to couple the main gate terminal and the main body terminal to the second terminal when the first potential on the first terminal is less than the second potential on the second terminal.

2. The RF circuit of claim 1,
  wherein the main transistor comprises an NMOS transistor having a first width,
  wherein each of the first FET and the second FET comprises an NMOS transistor having a second width,
  wherein a ratio of the first width of main transistor to the second width of the pre-driver FETs is at least 1:25.

3. The RF circuit of claim 1, wherein the ratio of the first width of main transistor to the second width of the pre-driver FETs is at least 1:50.

4. The RF circuit of claim 1, wherein said ESD protection device comprises a plurality of stages, each of the plurality of stages including an associated said main transistor and an associated said pre-driver circuit, said plurality of stages being connected in series between said transmission path and said ground potential.

5. The RF circuit of claim 4, wherein said ESD protection device comprises:
  a first stage including a first main transistor and a first pre-driver circuit, the first main transistor having a first terminal connected to the transmission path and a second terminal connected to a first inter-stage node; and
  a second stage including a second main transistor and a second pre-driver circuit, the second main transistor having a first terminal connected to the first inter-stage node and a second terminal coupled to the ground potential.

6. The RF circuit of claim 5,
  wherein said first pre-driver circuit of said first stage includes a first pre-driver FET connected between the transmission path and a first source node and a second pre-driver FET connected between the first inter-stage node and the first source node, said first source node being connected to a first main gate terminal and a first body region of said first main transistor, and
  wherein said second pre-driver circuit of said second stage includes a third pre-driver FET connected between the first inter-stage node and a second source node and a fourth pre-driver FET coupled between ground potential and the second source node, said second source node being connected to a second main gate terminal and a second body region of said second main transistor.

7. The RF circuit of claim 5, further comprising at least one third stage coupled between the second stage and the ground potential.

8. The RF circuit of claim 1, wherein said RF circuit includes said antenna and said at least one of said transmitter circuit and said receiver circuit.

9. The RF circuit of claim 1, wherein the RF circuit comprises a switching circuit including:
  a plurality of communication ports;
  at least one antenna port; and
  a plurality of switches configured to selectively couple said at least one antenna port to one of said plurality of communication ports by way of an associated transmission path,
  wherein said one ESD protection device is connected to at least one of said associated transmission paths.

10. The RF circuit of claim 9, wherein said at least one ESD protection device comprises a plurality of ESD protection devices, each said protection device being connected between an associated said transmission path and ground.

11. The RF circuit of claim 9, wherein the antenna switching circuit further comprising a switch control circuit configured to selectively control the plurality of switches.

12. The RF circuit of claim 1, wherein the RF device comprises a front end circuit configured to process radio frequency (RF) signals captured by said antenna, said front end circuit including a filter circuit, wherein said transmission path is configured to transmit said RF signals from the antenna to said filter circuit.

13. A radio frequency (RF) circuit configured to transmit input signals between an antenna and at least one of a transmitter circuit and a receiver circuit by way of a transmission path, wherein the RF circuit includes an ESD protection device connected between the transmission path and a ground potential, wherein the ESD protection device comprises:
  a main transistor having a first terminal coupled to the transmission path, a second terminal coupled to said ground potential, a main body region, and a main gate terminal connected to the main body region;
  a pre-driver circuit connected in parallel with the main transistor, the pre-driver circuit including:
    first field effect transistor (FET) having a first drain terminal connected to the first terminal of the main transistor, a first source terminal connected to the main gate terminal of the main transistor, and a first gate terminal connected to the second terminal of the main transistor; and
  a second FET having a second drain terminal connected to the second terminal of the main transistor, a second source terminal connected to said main gate terminal, and a second gate terminal connected to the first terminal of the main transistor
  wherein said ESD protection device comprises a plurality of stages, each of the plurality of stages including an associated said main transistor and an associated said pre-driver circuit, said plurality of stages being connected in series between said transmission path and said ground potential, and wherein each said stage of the plurality of stages comprises an associated resistor connected in parallel with said associated main transistor.

14. A radio frequency (RF) circuit configured to transmit input signals between an antenna and at least one of a transmitter circuit and a receiver circuit by way of a transmission path, wherein the RF circuit includes an ESD protection device comprising a plurality of stages connected in series between said transmission path and a ground potential, wherein each said stage includes:
- a main transistor having a first terminal, a second terminal, a main body region, and a main gate terminal connected to the main body region; and
- a pre-driver circuit connected in parallel with the main transistor, the pre-driver circuit including:
  - first field effect transistor (FET) having a first drain terminal connected to the first terminal of the main transistor, a first source terminal connected to the main gate terminal of the main transistor, and a first gate terminal connected to the second terminal of the main transistor; and
  - a second FET having a second drain terminal connected to the second terminal of the main transistor, a second source terminal connected to said main gate terminal, and a second gate terminal connected to the first terminal of the main transistor,
wherein each of the plurality of stages comprises an associated resistor connected in parallel with said associated main transistor.

15. The RF circuit of claim 14,
wherein the main transistor of each said stage comprises an NMOS transistor having a first width,
wherein each of the first FET and the second FET of each said stage comprises an NMOS transistor having a second width,
wherein a ratio of the first width of main transistor to the second width of the pre-driver FETs is at least 1:25.

16. The RF circuit of claim 14, wherein said plurality of stages comprises:
- a first stage including a first main transistor and a first pre-driver circuit, the first main transistor having a first terminal connected to the transmission path and a second terminal connected to a first inter-stage node; and
- a second stage including a second main transistor and a second pre-driver circuit, the second main transistor having a first terminal connected to the first inter-stage node and a second terminal coupled to the ground potential.

17. The RF circuit of claim 16,
wherein said first pre-driver circuit of said first stage includes a first pre-driver FET connected between the transmission path and a first source node and a second pre-driver FET connected between the first inter-stage node and the first source node, said first source node being connected to a first main gate terminal and a first body region of said first main transistor, and
wherein said second pre-driver circuit of said second stage includes a third pre-driver FET connected between the first inter-stage node and a second source node and a fourth pre-driver FET coupled between ground potential and the second source node, said second source node being connected to a second main gate terminal and a second body region of said second main transistor.

18. The RF circuit of claim 16, further comprising at least one third stage coupled between the second stage and the ground potential.

* * * * *